United States Patent
Otomo

(10) Patent No.: US 6,903,804 B2
(45) Date of Patent: Jun. 7, 2005

(54) PROJECTION OPTICAL SYSTEM AND PROJECTION AND LIGHT EXPOSURE APPARATUS USING IT

(75) Inventor: Ryoko Otomo, Saitama (JP)

(73) Assignee: Fujinon Corporation, Saitama (JP)

( * ) Notice: Subject to any disclaimer, the term of this patent is extended or adjusted under 35 U.S.C. 154(b) by 7 days.

(21) Appl. No.: 10/902,954

(22) Filed: Aug. 2, 2004

(65) Prior Publication Data

US 2005/0002007 A1 Jan. 6, 2005

Related U.S. Application Data

(62) Division of application No. 10/101,069, filed on Mar. 20, 2002, now Pat. No. 6,816,236.

(30) Foreign Application Priority Data

Mar. 28, 2001 (JP) ........................................ 2001-092001

(51) Int. Cl.[7] .............................. G03B 27/54; G02B 3/00
(52) U.S. Cl. .......................................... 355/67; 359/649
(58) Field of Search ................................ 355/53, 67–71; 359/357, 760, 683, 687, 649

(56) References Cited

U.S. PATENT DOCUMENTS

| | | | |
|---|---|---|---|
| 4,997,265 A | * | 3/1991 | Nishina ....................... 359/679 |
| 5,313,330 A | | 5/1994 | Betensky |
| 5,606,459 A | * | 2/1997 | Nakatsuji ..................... 359/683 |
| 6,008,884 A | * | 12/1999 | Yamaguchi et al. .......... 355/54 |
| 6,215,599 B1 | * | 4/2001 | Ohtake ....................... 359/688 |
| 6,366,412 B1 | * | 4/2002 | Noda et al. ................. 359/760 |
| 6,433,938 B1 | * | 8/2002 | Kawamura ................... 359/687 |
| 6,459,534 B1 | * | 10/2002 | Kato et al. .................. 359/649 |

FOREIGN PATENT DOCUMENTS

JP          3026648          1/2000

* cited by examiner

*Primary Examiner*—Henry Hung Nguyen
(74) *Attorney, Agent, or Firm*—Arnold International; Bruce Y. Arnold

(57) ABSTRACT

A projection optical system is disclosed that includes six lens groups, four of which are positioned in pairs symmetrically about a stop. The second and fifth lens groups, in order from the object side, may be positioned symmetrically about the stop but are also adjustable asymetrically about the stop in order to adjust the magnification of the projection optical system. The first and sixth lens groups, in order from the object side, function to make the projection optical system substantially telecentric on both the object side and the image side, respectively. Also disclosed is a projection and light exposure apparatus that uses the projection optical system of the present invention. The projection and light exposure apparatus automatically detects the image magnification and, based on the detection result, adjusts the positions of the second and fifth lens groups G2 and G5 as a unit so as to maintain a specified magnification.

10 Claims, 15 Drawing Sheets

Spherical Aberration

Astigmatism

Distortion

Lateral Aberration

Spherical Aberration

Astigmatism

Distortion

Lateral Aberration

Spherical Aberration

Astigmatism

Distortion

Lateral Aberration

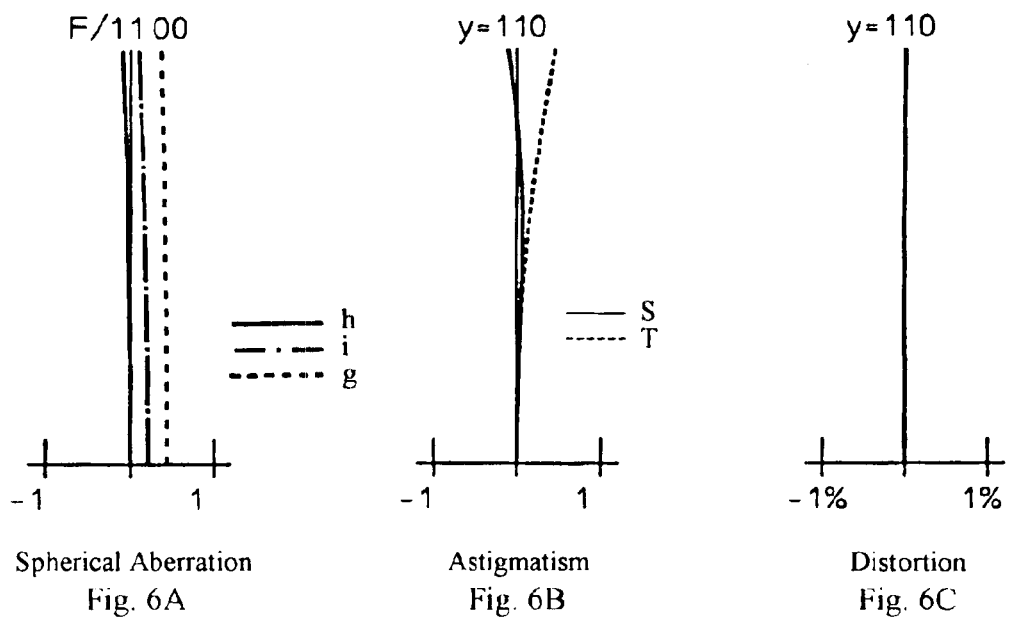
Spherical Aberration
Fig. 6A
Astigmatism
Fig. 6B
Distortion
Fig. 6C
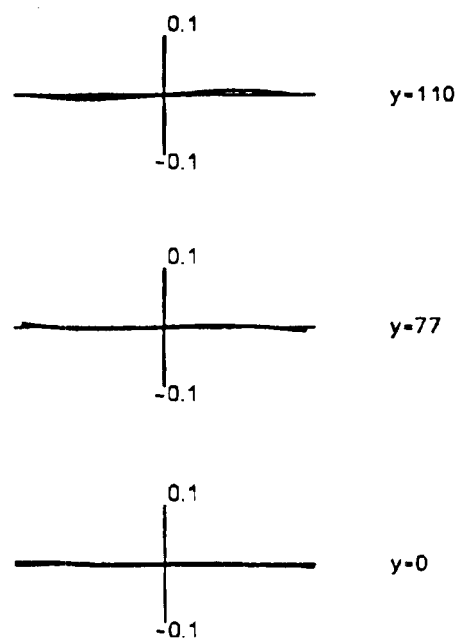
Lateral Aberration
Fig. 6D

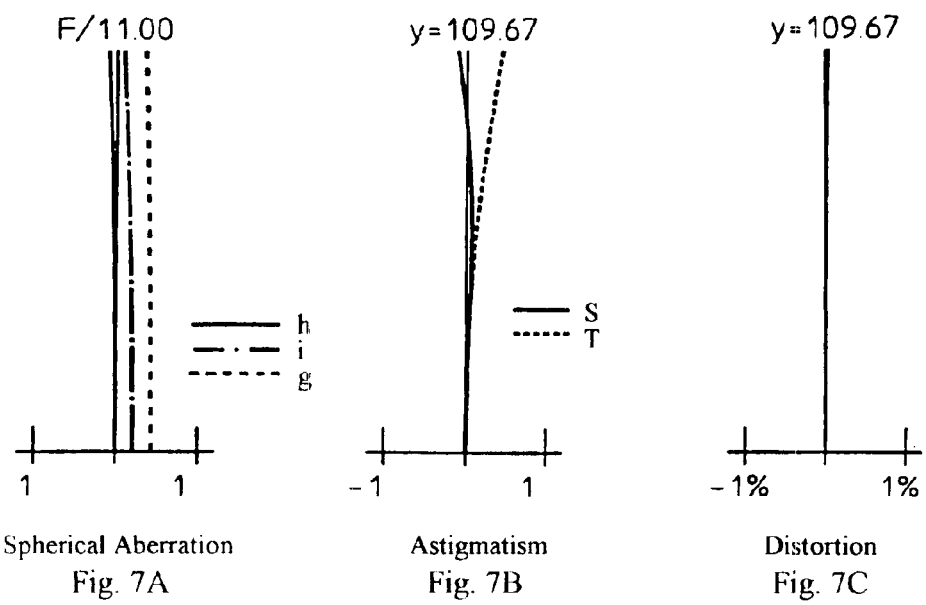
Spherical Aberration
Fig. 7A
Astigmatism
Fig. 7B
Distortion
Fig. 7C
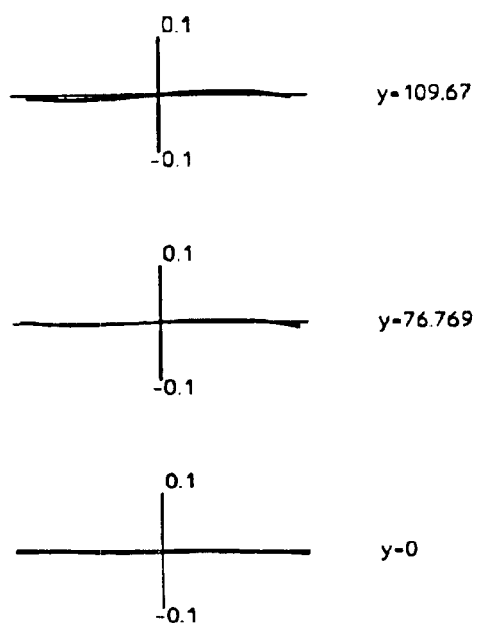
Lateral Aberration
Fig. 7D

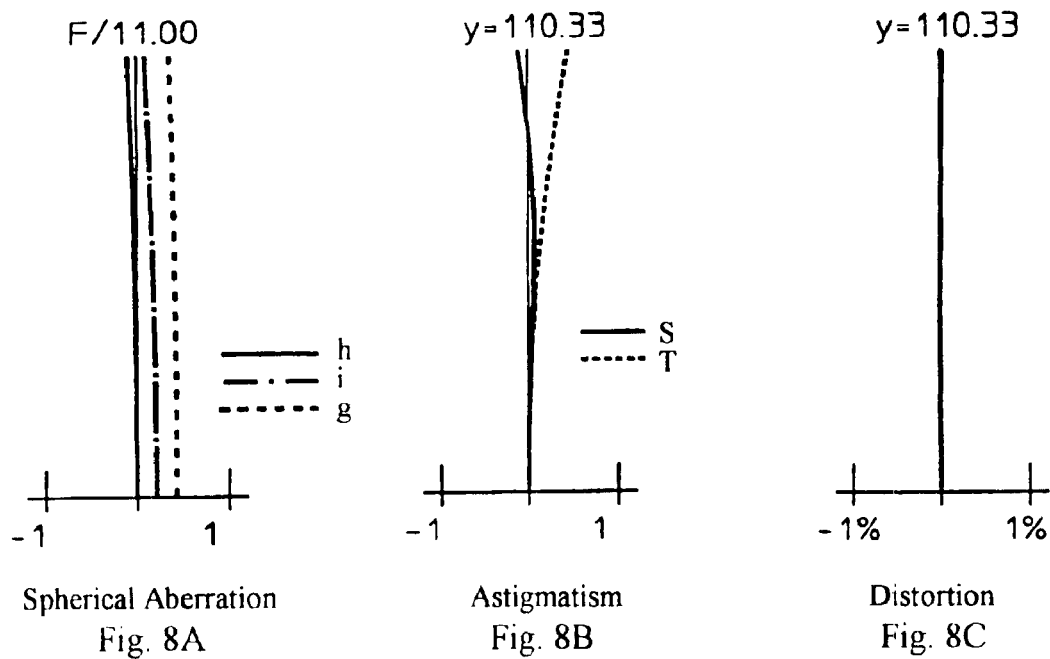
Spherical Aberration
Fig. 8A
Astigmatism
Fig. 8B
Distortion
Fig. 8C
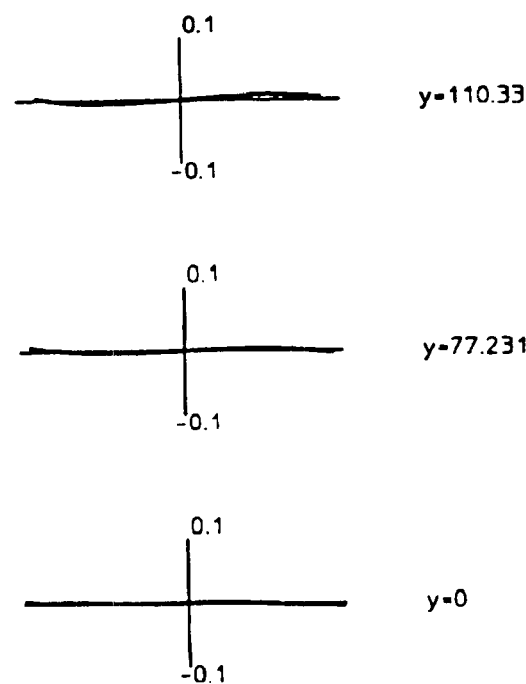
Lateral Aberration
Fig. 8D Spherical Aberration Astigmatism Distortion Lateral Aberration

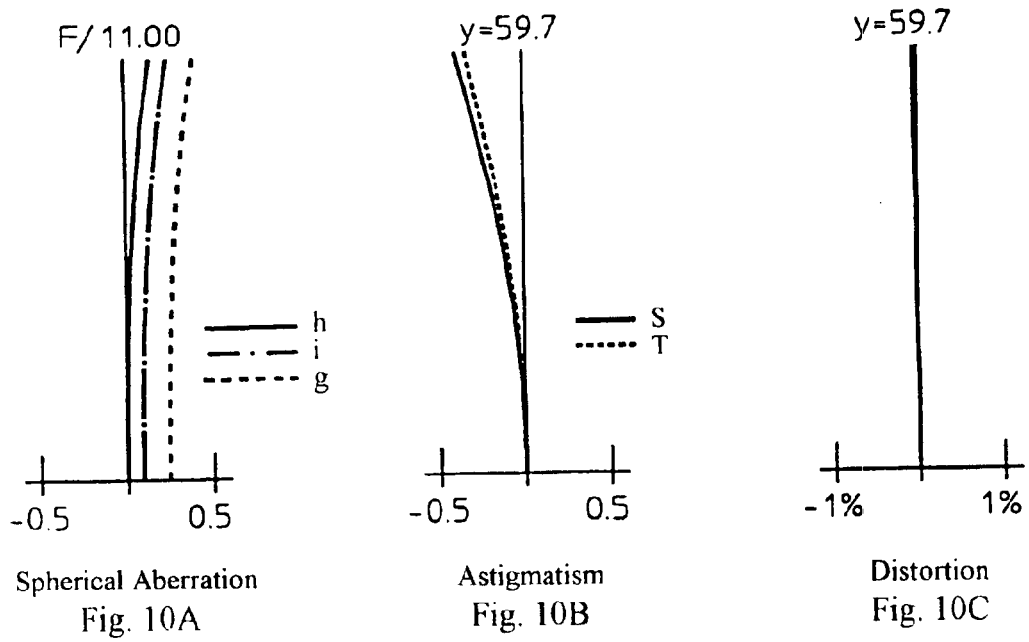
Spherical Aberration
Fig. 10A
Astigmatism
Fig. 10B
Distortion
Fig. 10C
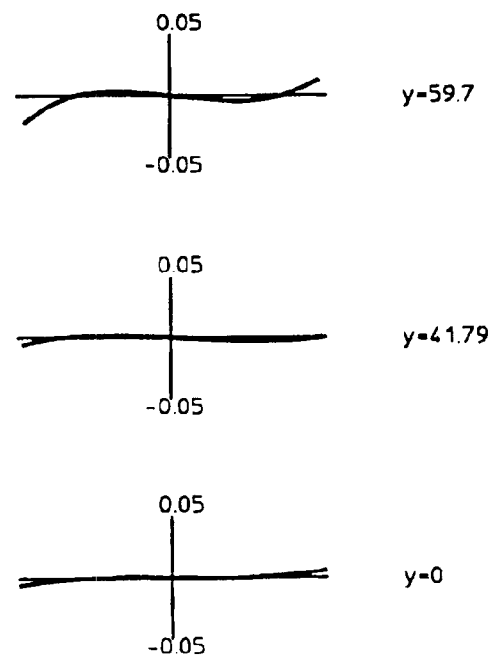
Lateral Aberration
Fig. 10D

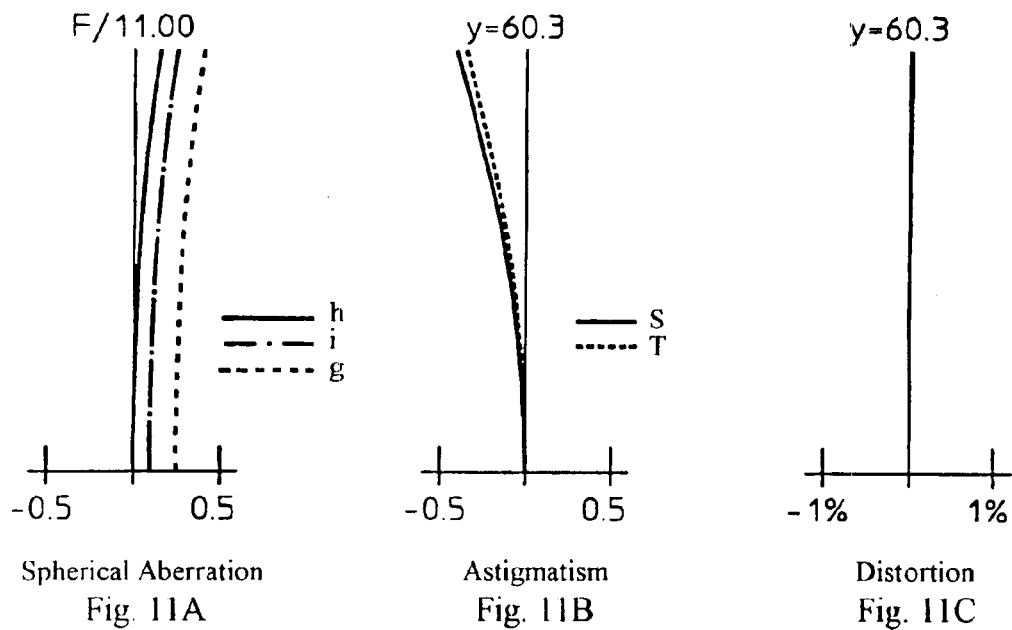
Spherical Aberration
Fig. 11A
Astigmatism
Fig. 11B
Distortion
Fig. 11C
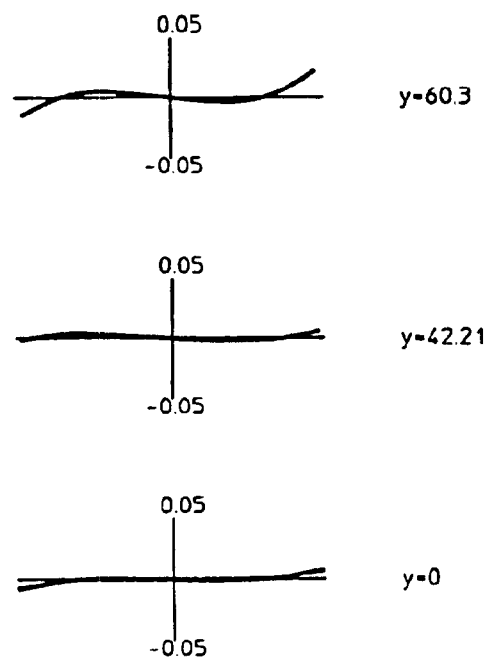
Lateral Aberration
Fig. 11D

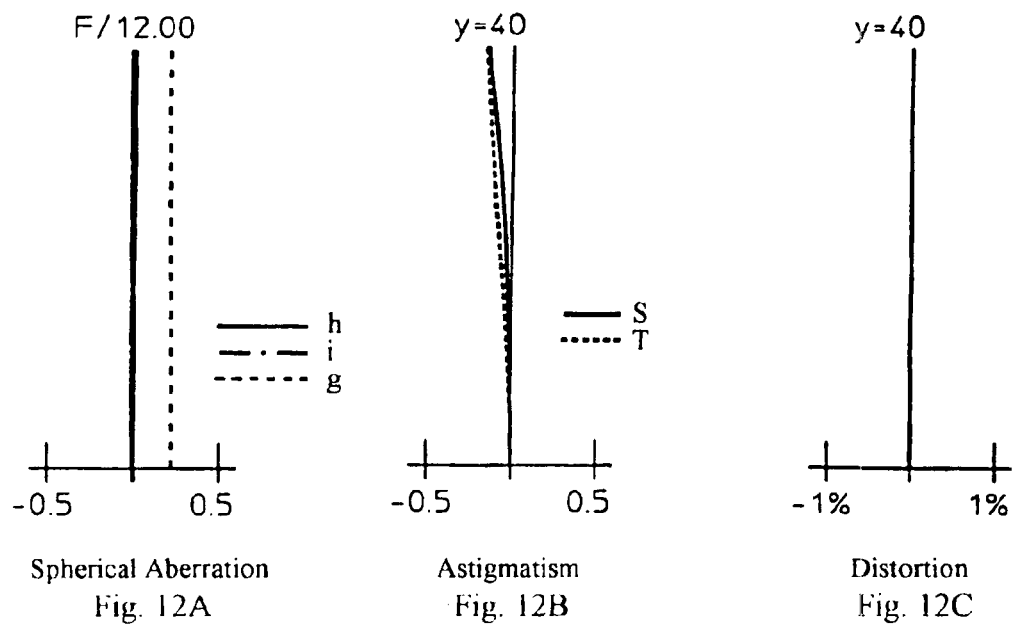
Spherical Aberration
Fig. 12A
Astigmatism
Fig. 12B
Distortion
Fig. 12C
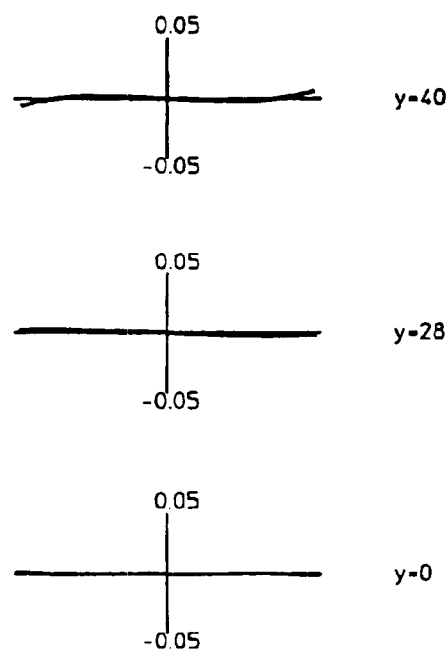
Lateral Aberration
Fig. 12D

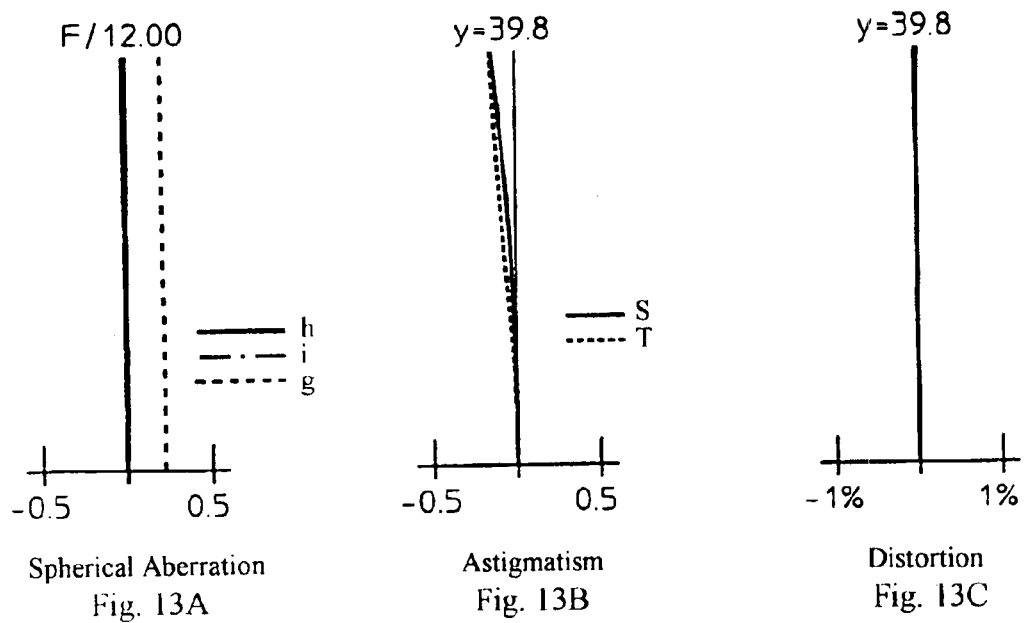
Spherical Aberration
Fig. 13A
Astigmatism
Fig. 13B
Distortion
Fig. 13C
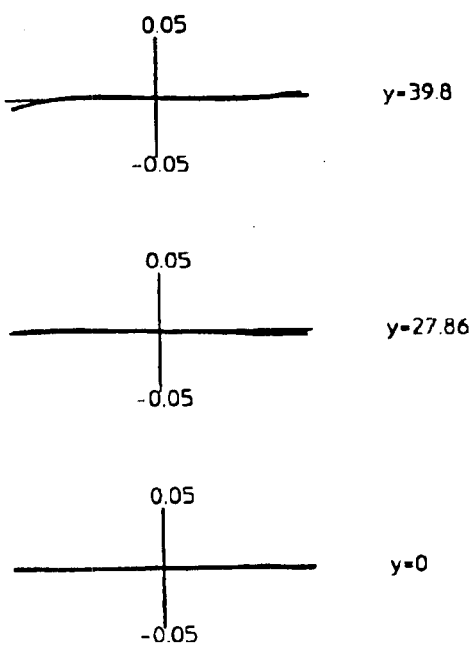
Lateral Aberration
Fig. 13D

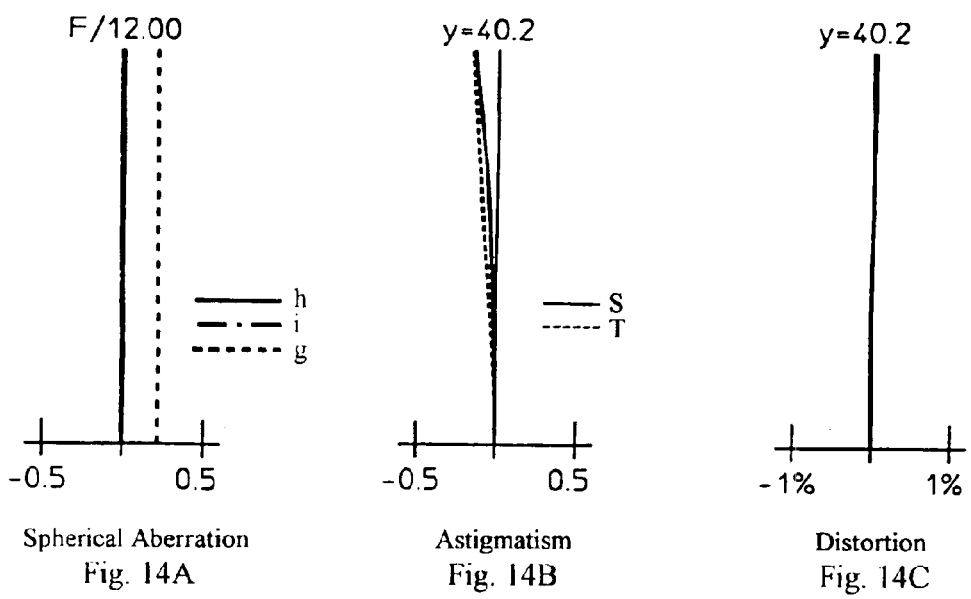
Spherical Aberration
Fig. 14A
Astigmatism
Fig. 14B
Distortion
Fig. 14C
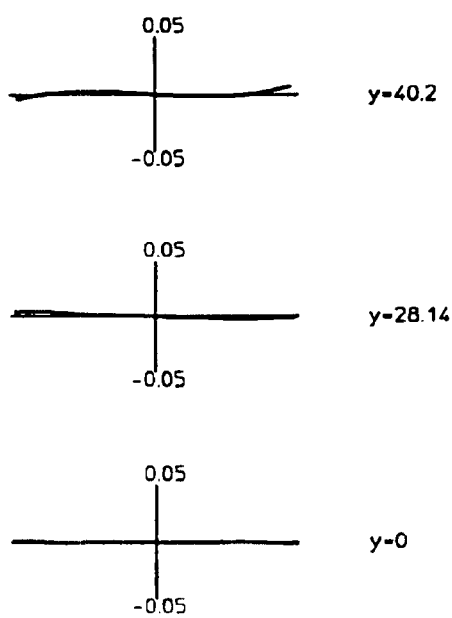
Lateral Aberration
Fig. 14D

PROJECTION OPTICAL SYSTEM AND PROJECTION AND LIGHT EXPOSURE APPARATUS USING IT

This application is a divisonal of application Ser. No. 10/101,069, filed Mar. 20, 2002, now U.S. Pat. No. 6,816,236.

BACKGROUND OF THE INVENTION

Conventionally, projection optical systems and projection and light exposure apparatus are known for use in projecting the pattern of an original onto a Surface in the production of a print board. Among these, an isometric magnification projection lens is disclosed in Japanese Patent No. 3026648 in which lens groups are symmetrically positioned in relation to a stop and light flux is nearly telecentric on both the object side and image side.

A lens system that is totally symmetric in relation to a stop forms all isometric image. However, in general, a totally symmetric lens system is difficult to obtain because of production errors in the components which make up the lens system. Image magnification is slightly deviated, and the deviation should be corrected in each lens system. When plural patterns are exposed on a board, the images should precisely overlap. Since the board expands or contracts with changes in temperature, minute adjustment of magnification is required in the course of exposure. In general, the entire lens system is moved along the optical axis to change the image magnification of the lens system. Because the projection lens system described above is telecentric on the object and image sides, moving the entire lens system along the optical axis does not result in a change in magnification.

BRIEF SUMMARY OF THE INVENTION

The present invention relates to a projection optical system and a projection and light exposure apparatus, especially one used to produce a print board. A first object of the present invention is to provide a projection optical system and a projection and light exposure apparatus that are telecentric on both the object side of a stop and the image side of the stop so as to allow for excellent correction of image magnification deviations caused by production errors in making the components. A second object of the invention is to provide a projection optical system and a projection and light exposure apparatus that will enable the adjustment of image magnification so as to compensate for the expansion or contraction of the print board due to changes in temperature in an easy manner while favorably correcting image aberrations.

BRIEF DESCRIPTION OF THE DRAWINGS

The present invention will become more fully understood from the detailed description given below and the accompanying drawings, which are given by way of illustration only and thus are not limitative of the present invention, wherein:

FIGS. 6A–6D show the spherical aberration, astigmatism, distortion, and lateral aberration at a magnification of 1.0 of the projection optical system of Embodiment 2;

FIGS. 7A–7D show the spherical aberration, astigmatism, distortion, and lateral aberration at a magnification of 0.997 of the projection optical system of Embodiment 2;

FIGS. 8A–8D show the spherical aberration, astigmatism, distortion, and lateral aberration at a magnification of 1.003 of the projection optical system of Embodiment 2;

FIGS. 10A–10D show the spherical aberration, astigmatism, distortion, and lateral aberration at a magnification of 0.995 of the projection optical system of Embodiment 3;

FIGS. 11A–11D show the spherical aberration, astigmatism, distortion, and lateral aberration at a magnification of 1.005 of the projection optical system of Embodiment 3;

FIGS. 12A–12D show the spherical aberration, astigmatism, distortion, and lateral aberration at a magnification of 1.0 of the projection optical system of Embodiment 4;

FIGS. 13A–13D show the spherical aberration, astigmatism, distortion, and lateral aberration at a magnification of 0.995 of the projection optical system of Embodiment 4;

FIGS. 14A–14D show the spherical aberration, astigmatism, distortion, and lateral aberration at a magnification of 1.005 of the projection optical system of Embodiment 4.

DETAILED DESCRIPTION

Broadly speaking, the projection optical system of tie invention is formed of six lens groups in sequential order from the object side, with a stop positioned substantially symmetrically between the third and fourth lens groups. The first and sixth lens groups serve to make the projection optical system have a long front and back focus, the second and fifth lens groups may be moved to asymmetric positions relative to the stop for magnification adjustment, and the third and fourth lens groups serve as a main optical system for imaging. Thus, the third and fourth lens groups are primarily the lens groups that contribute to favorable correction of aberrations.

More specifically, the projection optical system of the invention is formed of, in sequential order from the object side, a first lens group having positive refractive power, a second lens group having weak positive or negative refractive power, a third lens group that has positive or negative refractive power, a stop, a fourth lens group that has substantially the same refractive power as the third lens group, a fifth lens group that has substantially the same weak refractive power as the second lens group, and a sixth lens group that has positive refractive power. Further, the first and sixth lens groups, and the third and fourth lens groups, are each maintained so as to be substantially symmetrically positioned on opposite sides of the stop.

It is preferable that the projection optical system of the invention be substantially telecentric on both the object and image sides.

Further, it is preferable that the second and fifth lens groups are movable along the optical axis in the same direction and amount for a specified change in magnification of the projection optical system, and that each of these lens groups be formed of a single lens element.

Where the second and fifth lens groups are of positive refractive power, it is preferred that the following Condition (1) is satisfied:

$$5.5 < f_2/f_f < 8.5 \quad \text{Condition (1)}$$

where $f_2$ is the focal length of the second lens group, in order from the object side, and $f_f$ is the resultant local length of the first, second, and third lens groups, in order from the object side.

Where the second and fifth lens groups are of negative refractive power, it is preferred that the following Condition (2) is satisfied:

$$-6.0 < f_2/f_f < -4.0 \quad \text{Condition (2)}$$

where $f_2$ and $f_f$ are as defined above.

A projection and light exposure apparatus according to the present invention uses the projection optical system of the invention in order to project onto a surface the pattern of an object, such is all original drawing that is illuminated by an illumination optical system.

Figure 1:
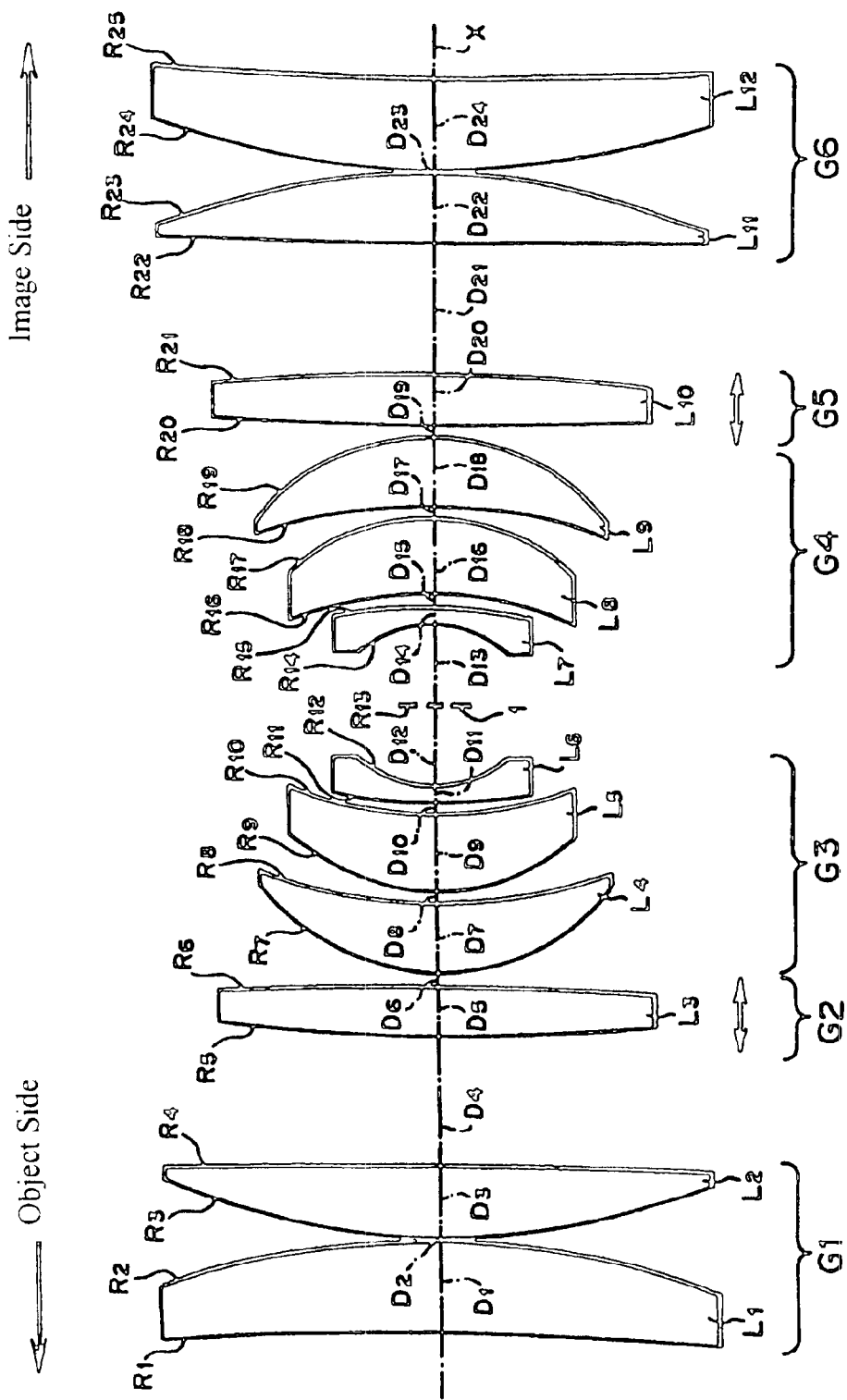
FIG. 1 shows the basic lens element configuration of the projection optical system of Embodiment 1, and is representative of the lens element configuration of Embodiment 2.

The invention will first be described in general terms. FIG. 1 shows the basic lens element configuration of the projection optical system of one embodiment of the invention, wherein the second and fifth lens groups are of positive refractive power.

As is shown in FIG. 1, the projection optical system of the invention may be formed of, in order from the object side, a first lens group G1 of positive refractive power that serves for obtaining telecentric light flux, a second lens group G2 that has weak positive refractive power and serves for magnification adjustment, a third lens group G3 that serves for aberration correction, a stop 1, a fourth lens group G4 that serves for aberration correction, a fifth lens group G5 that has weak positive refractive power and serves for magnification adjustment, and a sixth lens group G6 that is positive and serves for obtaining telecentric light flux. The entire lens system is symmetric in relation to the stop 1.

The first lens group G1 is formed of, in order from the object side, a first lens element $L_1$ that is a positive meniscus lens with its convex surface on the image side and a second lens element $L_2$ that is a biconvex lens having surfaces of different radii of curvature, with the surface of smaller radius of curvature on the object side. The second lens group G2 is formed of a third lens element $L_3$ that is a biconvex lens that is movable along the optical axis. The third lens group G3 is formed of a fourth lens element $L_4$ and a fifth lens element $L_5$, each being a positive meniscus lens with its convex surface on the object side, and a sixth lens element $L_6$ that is a negative meniscus lens with its convex surface on the object side. The fourth lens group G4 is formed of, in order from the object side, a seventh lens element $L_7$ that is a negative meniscus lens with its convex surface on the image side, an eighth lens element $L_8$ and a ninth lens element $L_9$, each being a positive meniscus lens with its convex surface on the image side. The fifth lens group G5 is formed of a tenth lens element $L_{10}$ that is a biconvex lens which is movable along the optical axis. The sixth lens group G6 is formed of, in order from the object side, an eleventh lens element $L_{11}$ that is a biconvex lens having surfaces of different radii of curvature, with the surface of smaller radius of curvature on the image side, and a twelfth lens element $L_{12}$ that is a positive meniscus lens with its convex surface on the object side.

As described above, the first and sixth lens groups serve to make the projection optical system substantially telecentric on both the object side and the image side, respectively.

The second and fifth lens groups G2 and G5 serve for magnification adjustment, and may be moved as a unit along the optical axis in order to change the magnification of an image. Thus, the second and fifth lens groups may be moved from being symmetrically positioned about the stop to being somewhat asymmetrically positioned about the stop. For magnification adjustment, this pair of single lens elements having weak refractive power is moved along the optical axis in the same direction and the same distance, thereby allowing a magnification adjustment with only a small fluctuation in aberrations. In addition, a small number of lens elements is moved during magnification adjustment, and thus a relatively small driving force is required for magnification adjustment. Further, as mentioned above, where the second and fifth lens groups are of positive refractive power, it is preferred that Condition (1) above is satisfied. On the other hand, where the second and fifth lens groups are of negative refractive power, it is preferred that Condition (2) above is satisfied.

Several specific embodiments of the invention will now be set forth in detail.

Embodiment 1

FIG. 1 shows the lens element configuration for this embodiment of the invention. As FIG. 1 was discussed above in describing the invention in general terms, further discussion will be omitted.

As noted above, in this embodiment the second and fifth lens groups are of positive refractive power. Condition (1) is the operative condition when the second and fifth lens groups are each of positive refractive power. When the lower limit of Condition (1) is not satisfied, the second lens group G2 has excessively strong positive refractive power. A small movement of the lens along the optical axis leads to a significant change in magnification. Therefore, excessively high accuracy in positioning of the second lens group is required.

When the upper limit of Condition (1) is not satisfied, the positive refractive power of the second lens group G2 is too weak. Thus, excessive movement of the second lens group is required for magnification change, making the design of the movement mechanism difficult.

Table 1 below lists the surface # in order from the object side, the radius of curvature R (in mm) of each surface, the on-axis spacing D (in mm) between surfaces, and the index of refraction $N_\lambda$ (at the incident light wavelength λ) of the optical components of Embodiment 1. In the bottom portion of the table are listed the wavelength used in determining the index of refraction, the f-number $F_{NO}$, the focal length f of the projection optical system, the focal length of the first, second, and third lens groups $f_f$, the focal length of the second lens group $f_2$, and the value of the ratio $f_2/f_f$.

TABLE 1

| # | R | D | $N_\lambda$ |
|---|---|---|---|
| 1 | −2003.796 | 41.193 | 1.52975 |
| 2 | −386.136 | 1.377 | |
| 3 | 331.627 | 32.365 | 1.52975 |
| 4 | −5239.961 | 61.490 | |
| 5 | 1027.462 | 23.090 | 1.49898 |
| 6 | −2245.495 | 6.199 | |
| 7 | 101.047 | 31.801 | 1.49898 |
| 8 | 236.865 | 5.544 | |
| 9 | 95.702 | 35.276 | 1.50726 |
| 10 | 174.526 | 5.325 | |
| 11 | 222.906 | 8.305 | 1.65072 |
| 12 | 52.634 | 38.097 | |
| 13 | ∞ (stop) | 38.097 | |
| 14 | −52.634 | 8.305 | 1.65072 |
| 15 | −222.906 | 5.325 | |
| 16 | −174.526 | 35.276 | 1.50726 |
| 17 | −95.702 | 5.544 | |
| 18 | −236.865 | 31.801 | 1.49898 |
| 19 | −101.047 | 6.199 | |
| 20 | 2245.495 | 23.090 | 1.49898 |
| 21 | −1027.462 | 61.490 | |
| 22 | 5239.961 | 32.365 | 1.52975 |
| 23 | −331.627 | 1.377 | |
| 24 | 386.136 | 41.193 | 1.52975 |
| 25 | 2003.796 | | |

$\lambda$ = 404.66 nm
$F_{NO}$ = 11.0
f = 2000.
$f_f$ = 189.599
$f_2$ = 1416.033
$f_2/f_f$ = 7.469

TABLE 2

| # | R | D | $N_\lambda$ |
|---|---|---|---|
| 1 | −1920.323 | 39.661 | 1.52975 |
| 2 | −397.408 | 9.167 | |
| 3 | 340.717 | 31.982 | 1.52975 |
| 4 | −6343.752 | 54.201 | |
| 5 | 941.954 | 36.208 | 1.49898 |
| 6 | −2082.215 | 2.866 | |
| 7 | 103.072 | 35.941 | 1.49898 |
| 8 | 239.242 | 0.496 | |
| 9 | 97.608 | 33.813 | 1.50726 |
| 10 | 176.588 | 9.681 | |
| 11 | 228.465 | 5.949 | 1.65072 |
| 12 | 53.432 | 40.818 | |
| 13 | ∞ (stop) | 40.818 | |
| 14 | −53.432 | 5.949 | 1.65072 |
| 15 | −228.465 | 9.681 | |
| 16 | −176.588 | 33.813 | 1.50726 |
| 17 | −97.608 | 0.496 | |
| 18 | −239.242 | 35.941 | 1.49898 |
| 19 | −103.072 | 2.866 | |
| 20 | 2082.215 | 36.208 | 1.49898 |
| 21 | −941.954 | 54.201 | |
| 22 | 6343.752 | 31.982 | 1.52975 |
| 23 | −340.717 | 9.167 | |
| 24 | 397.408 | 39.661 | 1.52975 |
| 25 | 1920.323 | | |

$\lambda$ = 404.66 nm
$F_{NO}$ = 11.0
f = 2000.
$f_f$ = 196.382
$f_2$ = 1304.964
$f_2/f_f$ = 6.645

As is apparent from comparing the value of $f_2/f_f$ listed above with the range for the operative condition, this embodiment satisfies Condition (1) above.

Figure 3A:
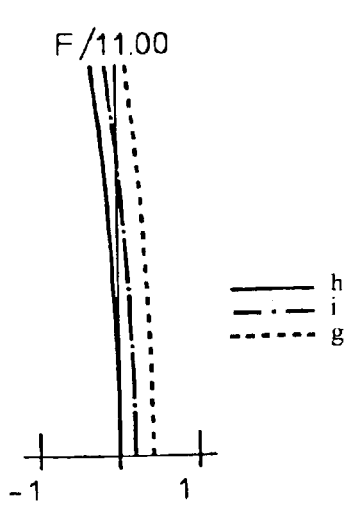
FIGS. 3A–3D show the spherical aberration, astigmatism, distortion, and lateral aberration at a magnification of 1.0 of the projection optical system of Embodiment 1.
Figure 3B:
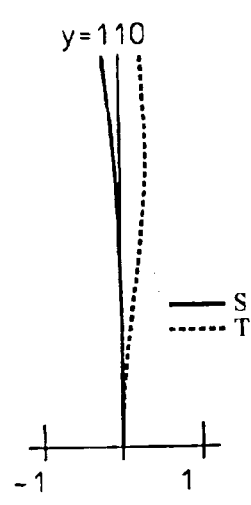
Figure 3C:
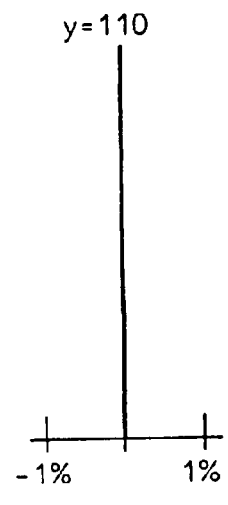
Figure 3D:
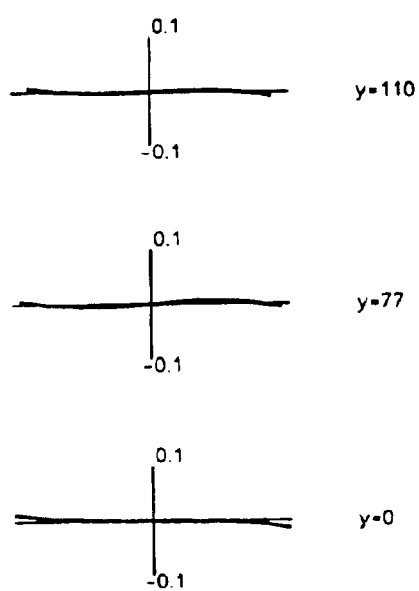
Figure 4A:
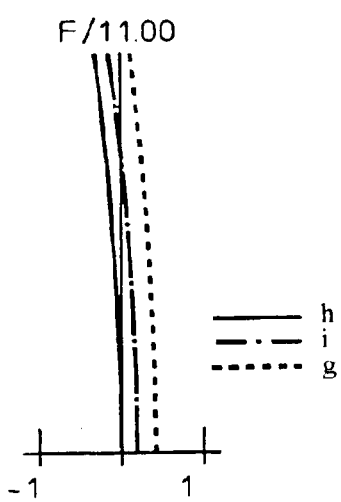
FIGS. 4A–4D show the spherical aberration, astigmatism, distortion, and lateral aberration at a magnification of 0.997 of the projection optical system of Embodiment 1.
Figure 4B:
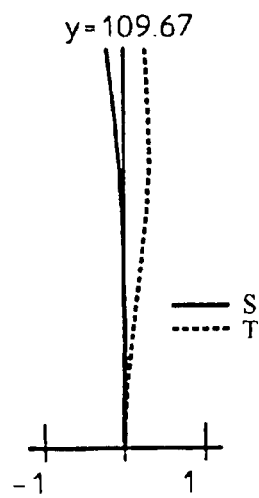
Figure 4C:
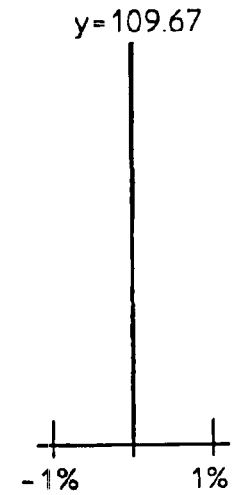
Figure 4D:
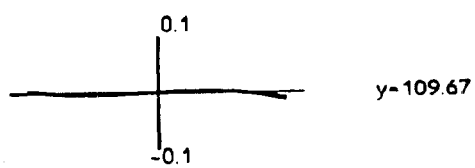
Figure 4D:
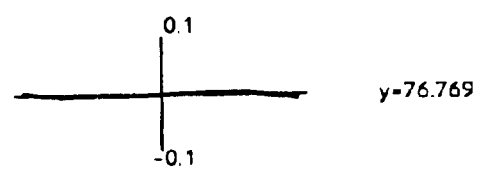
Figure 4D:
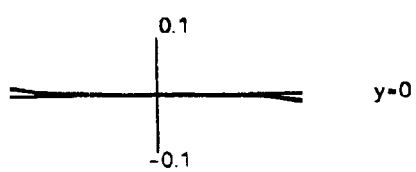
Figure 5A:
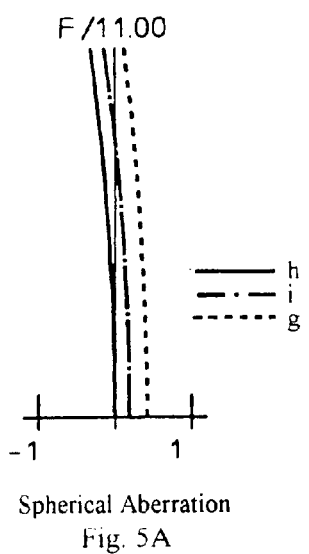
FIGS. 5A–5D show the spherical aberration, astigmatism, distortion, and lateral aberration at a magnification of 1.003 of the projection optical system of Embodiment 1.
Figure 5B:
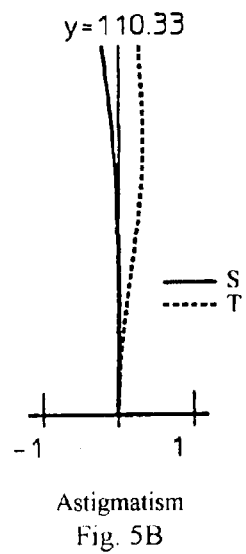
Figure 5C:
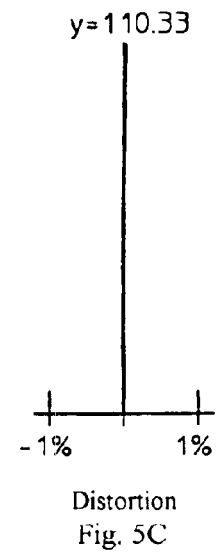
Figure 5D:
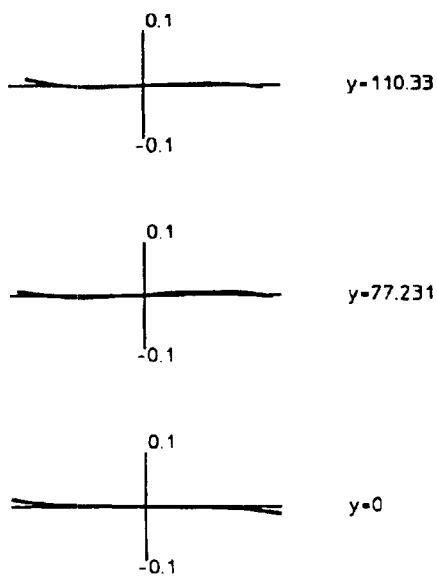

FIGS. 3A, 3B, 3C, and 3D show the spherical aberration (in mm), astigmatism (in mm), distortion, and lateral aberration (in mm), respectively, of the projection optical system according to the first embodiment at an image magnification of 1.000. FIGS. 4A, 4B, 4C, and 4D show these same respective aberrations at an image magnification of 0.997, and FIGS. 5A, 5B, 5C, and 5D show these same respective aberrations at an image magnification of 1.003. In FIGS. 3A, 4A and 5A, the spherical aberration is shown for each of the h, i and g lines. In FIGS. 3B, 4B, and 5B, the astigmatism is shown for both the sagittal S and tangential T image planes. In these figures, "y" is the image height (in mm). As is apparent from viewing these figures, the projection optical system of Embodiment 1 has its aberrations favorably corrected throughout a magnification adjustment range centered about unity magnification (i.e., the isometric magnification point).

Embodiment 2

The projection optical system of Embodiment 2 has the same basic lens element configuration as that of Embodiment 1, and thus is also illustrated by FIG. 1, described above. Once again, Condition (1) is the operative condition.

Table 2 below lists the surface # in order from the object side, the radius of curvature R (in mm) of each surface, the on-axis spacing D (in mm) between surfaces, and the index of refraction $N_\lambda$ (at the incident light wavelength $\lambda$) of the optical components of Embodiment 2. In the bottom portion of the table are listed the wavelength used in determining the index of refraction, the f-number $F_{NO}$, the focal length f of the projection optical system, the focal length of the first, second, and third lens groups $f_f$, the focal length of the second lens group $f_2$, and the value of the ratio $f_2/f_f$.

As is apparent from comparing the value of $f_2/f_f$ listed above with the range for the operative condition, this embodiment satisfies Condition (1) above.

FIGS. 6A, 6B, 6C, and 6D show the spherical aberration (in mm), astigmatism (in mm), distortion, and lateral aberration (in mm), respectively, of the projection optical system according to the second embodiment at an image magnification of 1.000. FIGS. 7A, 7B, 7C, and 7D show these same respective aberrations at an image magnification of 0.997, and FIGS. 8A, 8B, 8C, and 8D show these same respective aberrations at an image magnification of 1.003. In FIGS. 6A, 7A and 8A, the spherical aberration is shown for each of the h, i and g lines. In FIGS. 6B, 7B, and 8B, the astigmatism is shown for both the sagittal S and tangential T image planes. In these figures, "y" is the image height (in mm). As is apparent from viewing these figures, the projection optical system of Embodiment 2 has its aberrations favorably corrected throughout a magnification adjustment range centered about unity magnification (i.e., the isometric magnification point).

Embodiment 3

Figure 2:
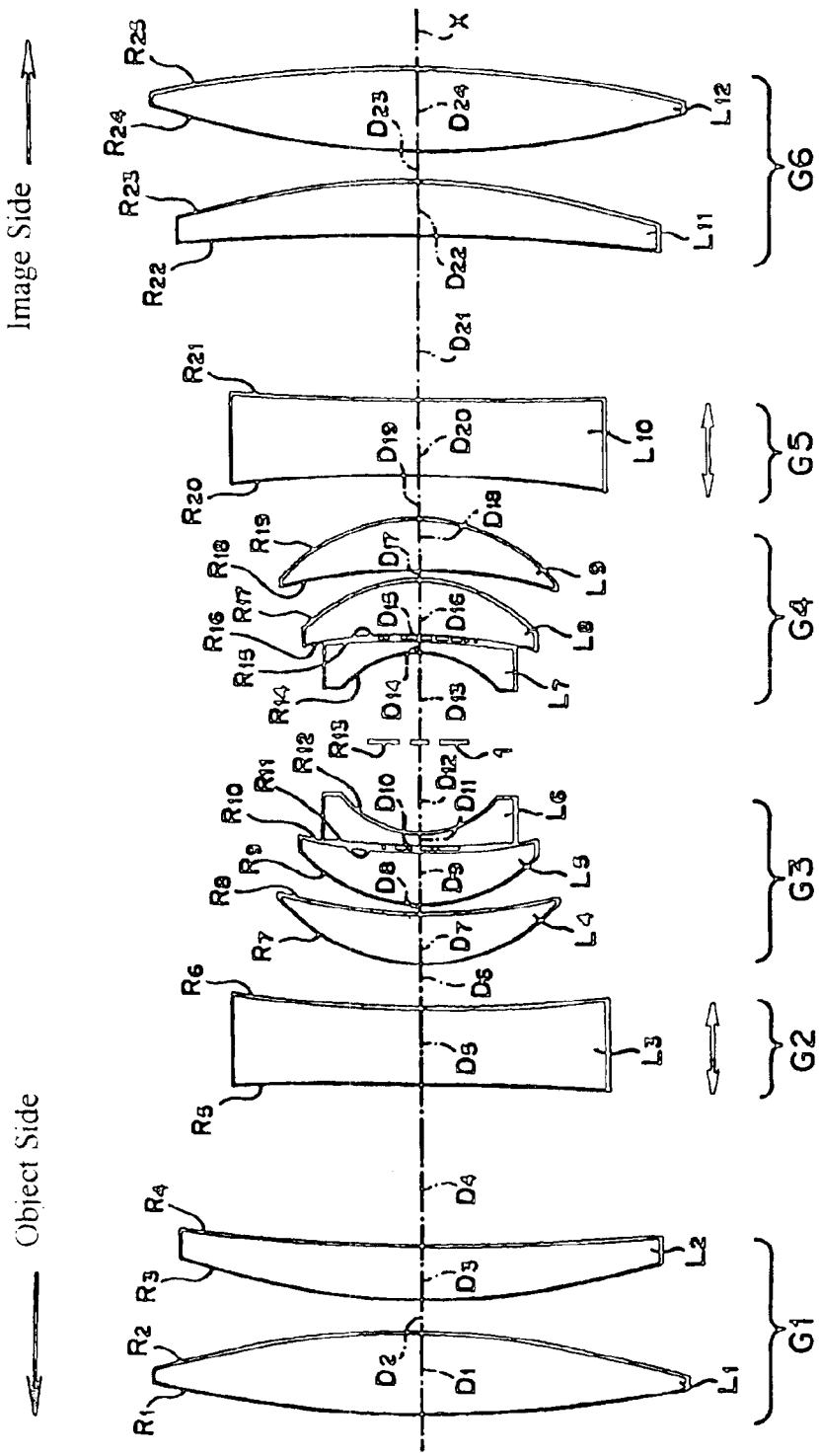
FIG. 2 shows the basic lens element configuration of the projection optical system of Embodiment 3, and is representative of the lens element configuration of Embodiment 4.

FIG. 2 illustrates the basic lens element configuration of the projection optical system according to Embodiment 3 of the invention. As before the projection optical system is formed of six lens groups containing a total of 12 lens elements. However, the differences are that, in this embodiment:

(a) the second and fifth lens groups G2 and G5 each have negative refractive power and consist of a single biconcave lens ($L_3$ and $L_{10}$, respectively);

(b) the first lens group G1 is instead formed of, in sequential order from the object side, a first lens element $L_1$ that is biconvex with surfaces of different radii of curvature and the surface of smaller radius of curvature on the image side, and a second lens element $L_2$ that is a positive meniscus lens with its convex surface on the object side; and (c) the sixth lens group G6 is instead formed of, in sequential order from the object side, an eleventh lens element $L_{11}$ that is a positive meniscus lens with its convex surface on the image side, and a twelfth lens element $L_{12}$ that is a biconvex lens having surfaces of different radii of curvature, with the surface of smaller radius of curvature on the object side.

Further, this embodiment satisfies Condition (2) above.

Table 3 below lists the surface # in order from the object side, the radius of curvature R (in mm) of each surface, the on-axis spacing D (in mm) between surfaces, and the index of refraction $N_\lambda$ (at the incident light wavelength λ) of the optical components of Embodiment 3. In the bottom portion of the table are listed the wavelength used in determining the index of refraction, the f-number $F_{NO}$, the focal length f of the projection optical system, the focal length of the first, second, and third lens groups $f_i$, the focal length of the second lens group $f_2$, and the value of the ratio $f_2/f_f$.

TABLE 3

| # | R | D | $N_\lambda$ |
|---|---|---|---|
| 1 | 354.641 | 22.810 | 1.52975 |
| 2 | −253.815 | 9.199 | |
| 3 | 215.696 | 14.682 | 1.52975 |
| 4 | 693.662 | 46.926 | |
| 5 | −1496.025 | 21.334 | 1.49898 |
| 6 | 480.589 | 12.982 | |
| 7 | 51.578 | 14.332 | 1.49898 |
| 8 | 160.571 | 2.990 | |
| 9 | 44.860 | 15.340 | 1.50726 |
| 10 | 149.013 | 1.066 | |
| 11 | 238.468 | 3.965 | 1.63776 |
| 12 | 28.481 | 26.197 | |
| 13 | ∞ | 26.197 | |
| 14 | −28.481 | 3.965 | 1.63776 |
| 15 | −238.468 | 1.066 | |
| 16 | −149.013 | 15.340 | 1.50726 |
| 17 | −44.860 | 2.990 | |
| 18 | −160.571 | 14.332 | 1.49898 |
| 19 | −51.578 | 12.982 | |
| 20 | −480.589 | 21.334 | 1.49898 |
| 21 | 1496.025 | 46.926 | |
| 22 | −693.662 | 14.682 | 1.52975 |
| 23 | −215.696 | 9.199 | |
| 24 | 253.815 | 22.810 | 1.52975 |
| 25 | −354.641 | | |
| λ = 404.66 nm | | $f_f = 139.774$ | |
| $F_{NO} = 11.0$ | | $f_2 = -726.354$ | |
| f = 1500. | | $f_2/f_f = -5.197$ | |

As is apparent from comparing the value of $f_2/f_f$ listed above with the range for the operative condition, this embodiment satisfies Condition (2) above.

Figure 9A:
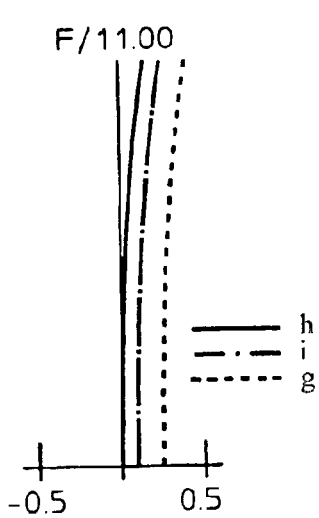
FIGS. 9A–9D show the spherical aberration, astigmatism, distortion, and lateral aberration at a magnification of 1.0 of the projection optical system of Embodiment 3.
Figure 9B:
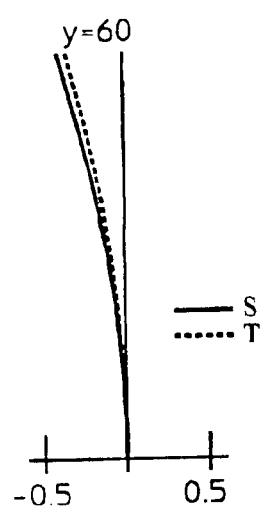
Figure 9C:
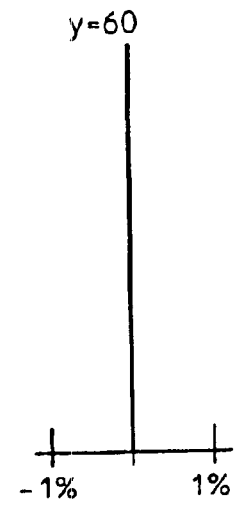
Figure 9D:
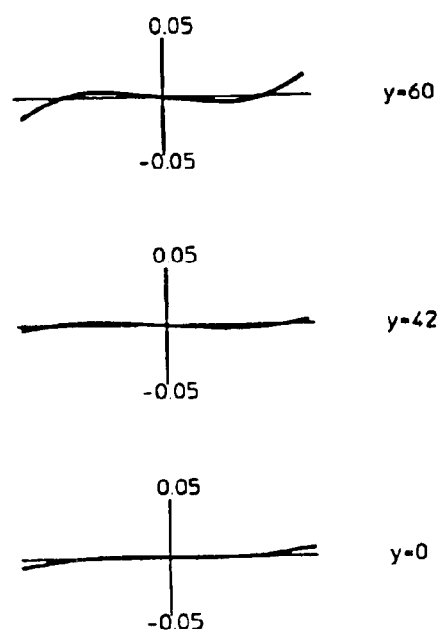

FIGS. 9A, 9B, 9C, and 9D show the spherical aberration (in mm), astigmatism (in mm), distortion, and lateral aberration (in mm), respectively, of the projection optical system according to the third embodiment at an image magnification of 1.000. FIGS. 10A, 10B, 10C, and 10D show these same respective aberrations at an image magnification of 0.995, and FIGS. 11A, 11B, 11C, and 11D show these same respective aberrations at an image magnification of 1.005. In FIGS. 9A, 10A and 11A, the spherical aberration is shown for each of the h, i and g lines. In FIGS. 9B, 10B, and 11B, the astigmatism is shown for both the sagittal S and tangential T image planes. In these figures, "y" is the image height (in mm). As is apparent from viewing these figures, the projection optical system of Embodiment 3 has its aberrations favorably corrected throughout a magnification adjustment range centered about unity magnification (i.e., the isometric magnification point).

Embodiment 4

The basic lens element configuration of this embodiment is the same as that of Embodiment 3, and thus is also illustrated by FIG. 2.

Table 4 below lists the surface # in order from the object side, the radius of curvature R (in mm) of each surface, the on-axis spacing D (in mm) between surfaces, and the index of refraction $N_\lambda$ (at the incident light wavelength λ) of the optical components of Embodiment 4. In the bottom portion of the table are listed the wavelength used in determining the index of refraction, the f-number $F_{NO}$, the focal length f of the projection optical system, the focal length of the first, second, and third lens groups $f_i$, the focal length of the second lens group $f_2$, and the value of the ratio $f_2/f_f$.

TABLE 4

| # | R | D | $N_\lambda$ |
|---|---|---|---|
| 1 | 251.184 | 15.704 | 1.52975 |
| 2 | −179.532 | 5.714 | |
| 3 | 152.491 | 10.547 | 1.52975 |
| 4 | 484.572 | 32.961 | |
| 5 | −898.824 | 14.867 | 1.49898 |
| 6 | 327.806 | 8.576 | |
| 7 | 36.384 | 10.335 | 1.49898 |
| 8 | 112.966 | 0.529 | |
| 9 | 31.643 | 9.156 | 1.50726 |
| 10 | 104.847 | 2.211 | |
| 11 | 168.708 | 3.541 | 1.63776 |
| 12 | 20.070 | 19.414 | |
| 13 | ∞ (stop) | 19.414 | |
| 14 | −20.070 | 3.541 | 1.63776 |
| 15 | −168.708 | 2.211 | |
| 16 | −104.847 | 9.156 | 1.50726 |
| 17 | −31.643 | 0.529 | |
| 18 | −112.966 | 10.335 | 1.49898 |
| 19 | −36.384 | 8.576 | |
| 20 | −327.806 | 14.867 | 1.49898 |
| 21 | 898.824 | 32.961 | |
| 22 | −484.572 | 10.547 | 1.52975 |
| 23 | −152.491 | 5.714 | |
| 24 | 179.532 | 15.704 | 1.52975 |
| 25 | −251.184 | | |
| λ = 404.66 nm | | $f_f = 99.324$ | |
| $F_{NO} = 12.0$ | | $f_2 = -479.451$ | |
| f = 1000. | | $f_2/f_f = -4.827$ | |

As is apparent from comparing the value of $f_2/f_f$ listed above with the range for the operative condition, this embodiment satisfies Condition (2) above.

FIGS. 12A, 12B, 12C, and 12D show the spherical aberration (in mm), astigmatism (in mm), distortion, and lateral aberration (in mm), respectively, of the projection optical system according to the fourth embodiment at an image magnification of 1.000. FIGS. 13A, 13B, 13C, and 13D show these same respective aberrations at an image magnification of 0.995, and FIGS. 14A, 14B, 14C, and 14D show these same respective aberrations at an image magnification of 1.005. In FIGS. 12A, 13A and 14A, the spherical aberration is shown for each of the h, i and g lines. In FIGS. 12B, 13B, and 14B, the astigmatism is shown for both the sagittal S and tangential T image planes. In these figures "y" is the image height (in mm). As is apparent from viewing these figures, the projection optical system of Embodiment 4 has its aberrations favorably corrected throughout a magnification adjustment range centered about unity magnification (i.e., the isometric magnification point).

Figure 15:
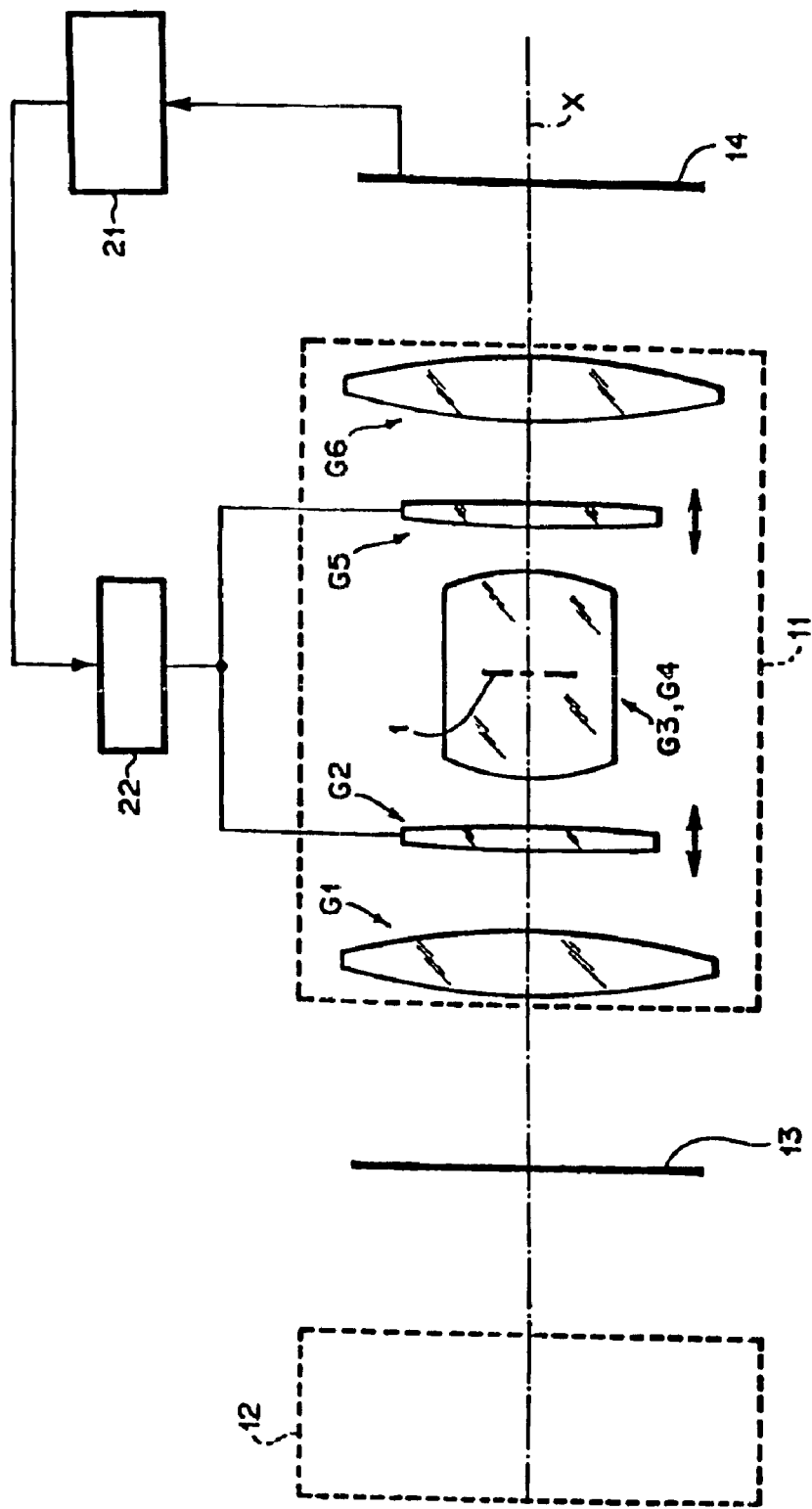
FIG. 15 is a schematic diagram showing the projection and light exposure apparatus according to an embodiment of the present invention.

FIG. 15 is a schematic presentation showing a projection and light exposure apparatus in which the projection optical system of the present invention is mounted.

The projection and light exposure apparatus comprises a light source and illumination optical system 12 that illuminates a mask pattern 13, a surface 14 such as a print board on which an image of the mask pattern 13 is projected and exposed to light, an image magnification detector 21 which detects the magnification of the image based on the size of the image of the mask pattern on the surface 14, and a driving means 22 for moving each of the second and fifth lens groups G2 and G5 of the projection optical system 11 along the optical axis x the same distance.

The projection and light exposure apparatus according to the present invention automatically detects the image magnification and, based on the detection result, adjusts the positions of the second and fifth lens groups G2 and G5 so as to maintain a specified magnification. Therefore, it allows for easy correction of deviation in image magnification that is caused by production errors in components as well as for adjustment of image magnification in accordance with the expansion or contraction of the board due to temperature changes.

The invention being thus described, it will be obvious that the same may be varied in many ways. For example, the number and shapes of the lens elements in each of the six lens groups can be appropriately selected. Such variations are not to be regarded as a departure from the spirit and scope of the invention. Rather, the scope of the invention shall be defined as set forth in the following claims and their legal equivalents. All such modifications as would be obvious to one skilled in the art are intended to be included within the scope of the following claims.

What is claimed is:

1. A projection optical system comprising, in sequential order from the object side:

a first lens group having positive refractive power;

a second lens group;

a third lens group that has one of positive or negative refractive power;

a stop;

a fourth lens group that has the same sign of refractive power as the third lens group;

a fifth lens group having the same sign of refractive power as the refractive power of the second lens group, the amount of refractive power of the second and fifth lens groups being small in comparison to the amount of refractive power of the third lens group; and a sixth lens group having positive refractive power;

wherein the first and sixth lens groups are positioned at substantially symmetric locations on opposite sides of the stop;

the second and fifth lens groups may be moved asymmetrically with respect to the stop along the optical axis from substantially symmetric locations on opposite sides of the stop so as to achieve magnification adjustment, and the third and fourth lens groups are positioned at substantially symmetric locations on opposite sides of the stop.

2. The projection optical system according to claim 1, wherein the first lens group and the sixth lens group, in order from the object side, are designed such that light that enters one side of said projection optical system will be substantially telecentric as it exits the opposite side of said projection optical system.

3. The projection optical system according to claim 2, wherein the second lens group and the fifth lens group are moved along the optical axis in the same direction and the same distance in adjusting the projection optical system to a different magnification.

4. The projection optical system according to claim 1, wherein the second lens group and the fifth lens group each consist of a single positive lens element.

5. The projection optical system according to claim 2, wherein the second lens group and the fifth lens group each consist of a single negative lens element.

6. The projection optical system as set forth in claim 2, in combination with a light exposure apparatus which projects a light pattern onto a surface.

7. The projection optical system according to claim 1, wherein the second lens group and the fifth lens group are moved along the optical axis in the same direction and the same distance in adjusting the projection optical system to a different magnification.

8. The projection optical system according to claim 1, wherein the second lens group and the fifth lens group each consist of a single positive lens element.

9. The projection optical system according to claim 1, wherein the second lens group and the fifth lens group each consist of a single negative lens element.

10. The projection optical system as set forth in claim 1, in combination with a light exposure apparatus which projects a light pattern onto a surface.

* * * * *

UNITED STATES PATENT AND TRADEMARK OFFICE
CERTIFICATE OF CORRECTION

PATENT NO. : 6,903,804 B2
DATED : June 7, 2005
INVENTOR(S) : Otomo

It is certified that error appears in the above-identified patent and that said Letters Patent is hereby corrected as shown below:

Column 1,
Line 12, change "Surface" to -- surface --;
Line 19, change "forms all" to -- forms an --; and Column 2,
Line 46, change "of tie" to -- of the --.

Signed and Sealed this

Twenty-third Day of August, 2005

JON W. DUDAS
*Director of the United States Patent and Trademark Office*